US 10,771,054 B2

(12) United States Patent
Greither et al.

(10) Patent No.: US 10,771,054 B2
(45) Date of Patent: Sep. 8, 2020

(54) CONTROL CIRCUIT FOR SOLID STATE POWER CONTROLLER

(71) Applicant: HS Elektronik Systeme GmbH, Nördlingen (DE)

(72) Inventors: Markus Greither, Augsburg (DE); David Kucharski, Delavan, WI (US)

(73) Assignee: HS ELEKTRONIK SYSTEME GMBH, Nordlingen (DE)

( * ) Notice: Subject to any disclaimer, the term of this patent is extended or adjusted under 35 U.S.C. 154(b) by 95 days.

(21) Appl. No.: 15/712,180

(22) Filed: Sep. 22, 2017

(65) Prior Publication Data

US 2018/0091138 A1    Mar. 29, 2018

(30) Foreign Application Priority Data

Sep. 26, 2016  (EP) .................................... 16190703

(51) Int. Cl.
| | |
|---|---|
| H03B 1/00 | (2006.01) |
| H03K 3/00 | (2006.01) |
| H03K 17/687 | (2006.01) |
| G06F 1/30 | (2006.01) |
| H03K 17/24 | (2006.01) |
| G06F 1/24 | (2006.01) |

(52) U.S. Cl.
CPC ............ *H03K 17/687* (2013.01); *G06F 1/24* (2013.01); *G06F 1/30* (2013.01); *H03K 17/24* (2013.01); *H03K 2217/0081* (2013.01)

(58) Field of Classification Search
CPC ................ H03K 17/687; H03K 17/24; H03K 2217/0081; G06F 1/24; G06F 1/30

USPC ......................................................... 327/108
See application file for complete search history.

(56) References Cited

U.S. PATENT DOCUMENTS

| | | | |
|---|---|---|---|
| 4,797,804 A | 1/1989 | Rockett, Jr. | |
| 5,752,047 A | 5/1998 | Darty et al. | |
| 7,193,905 B1 * | 3/2007 | Andreev .................. | G11C 8/10 365/189.08 |
| 7,310,755 B2 | 12/2007 | Mudge et al. | |
| 7,505,820 B2 | 3/2009 | Plivcic et al. | |
| 2006/0044723 A1 * | 3/2006 | Beneditz ................. | G06F 1/305 361/90 |

(Continued)

FOREIGN PATENT DOCUMENTS

| | | |
|---|---|---|
| EP | 2515439 A1 | 10/2012 |
| JP | 2008164866 A | 7/2008 |

OTHER PUBLICATIONS

Extended European Search Report for International Application No. 16190703.5 dated Mar. 30, 2017, 7 pages.

(Continued)

*Primary Examiner* — Metasebia T Retebo
(74) *Attorney, Agent, or Firm* — Cantor Colburn LLP

(57) ABSTRACT

A control circuit configured to supply a control voltage to a control terminal (G) of a solid state solid state switching device of a solid state power controller. The control circuit comprises: a primary controller operative to supply a primary control voltage to the control terminal (G) of the solid state switching device; and an auxiliary circuit configured to supply an auxiliary control voltage to the control terminal (G) of the solid state switching device in case the primary controller falls into an inoperative condition.

9 Claims, 2 Drawing Sheets

(56) References Cited

U.S. PATENT DOCUMENTS

2007/0285130 A1     12/2007  Tsu et al.
2009/0234469 A1*    9/2009   Meagher .............. H03K 17/163
                                                        700/79

OTHER PUBLICATIONS

European Communication pursuant to Article 94(3) EPC for Application No. 16 190 703.5-1203, dated Feb. 14, 2020, 10 pages.

* cited by examiner

CONTROL CIRCUIT FOR SOLID STATE POWER CONTROLLER

FOREIGN PRIORITY

This application claims priority to European Patent Application No. 16190703.5 filed Sep. 26, 2016, the entire contents of which is incorporated herein by reference.

FIELD

The present invention relates to a control circuit configured to supply a control voltage to a control terminal of a solid state switching device (in the following also referred to as SSSD) as used in a solid state power controller (in the following also referred to as SSPC) for distributing power. The present invention also relates to a solid state power controller comprising such control circuit.

BACKGROUND

Vehicles, such as aircraft, typically utilize one or more power distribution systems to distribute power from a primary power source to various vehicle systems. In aerospace, electrical power distribution SSPCs are used to switch the voltage from the power sources (e.g. generators or batteries) to the loads. Electronic switches are commonly used in place of mechanical relays to distribute power from the source to the load. A solid state power distribution system typically includes at least one electronic switching device, such as a field effect transistor (FET), and electronic circuitry that provides wiring protection. The electronic switching device and circuitry are usually built in semiconductor technology and therefore referred to as a solid state switching device ("SSSD") and solid state power controller ("SSPC"). SSPCs have found widespread use because of their desirable status capability, reliability, and packaging density. SSPCs are gaining acceptance as a modern alternative to the combination of conventional electromechanical relays and circuit breakers for commercial aircraft power distribution due to their high reliability, "soft" switching characteristics, fast response time, and ability to facilitate advanced load management and other aircraft functions.

Electronics used in aerospace is exposed to neutron radiation because aircraft are flying at high elevation. Modern chip technologies become more and more susceptible to such phenomena, but not much is known. Commercially available electronic components available "of the shelf" are not even tested for this condition. Especially, highly integrated devices with very small structures, like microcontrollers, show that susceptibility. Particularly, so called Single Event Upsets (SEU) or Single Event Latch-ups (SEL) may put a microcontroller in a condition where the software stops running and the microcontroller falls into an inoperative condition.

In most modern SSPC applications for aerospace, commercially available "of the shelf" microcontrollers are used. In order to deal with neutron radiation susceptibility, a mechanism has been suggested to cycle control power to the microcontroller when it is latching up due to the neutron radiation. While this strategy works, it implies that the SSPC momentarily turns off. This is undesirable, as it may have an impact to the electric loads on the aircraft supplied by the SSPC.

Therefore, it would be beneficial to avoid any change in the output state of the SSPC during, or following, a Single Event Upset (SEU) or Single Event Latch-up (SEL).

SUMMARY

Embodiments of the invention provide a control circuit configured to supply a control voltage to a control terminal of a solid state switching device of a solid state power controller, the solid state switching device having a first terminal, a second terminal, and the control terminal, the solid state switching device configured to switch between an OFF operation mode in which the second terminal is electrically disconnected from the first terminal, and an ON operation mode in which the second terminal is electrically connected to the first terminal, according to the control voltage applied to the control terminal. The control circuit comprises a primary controller operative to supply a primary control voltage to the control terminal of the solid state switching device and an auxiliary circuit configured to supply an auxiliary control voltage to the control terminal of the solid state switching device in case the primary controller falls into an inoperative condition. In an operative condition, the primary controller supplies the primary control voltage to the control terminal of the SSSD. In an inoperative condition, the primary controller stops supplying the primary control voltage to the control terminal of the SSSD, or at least fails to reliably supply the primary control voltage to the control terminal of the SSSD. An inoperative condition may include a Single Event Upset (SEU) or a Single Event Latch-up (SEL) caused by neutron radiation.

Further embodiments provide a solid state power controller configured to supply electric power from a power supply to at least one load, the solid-state power controller comprising at least one solid state switching device controlled by a control circuit as described herein.

Particularly, the primary controller may include a microcontroller, e.g. a commercially available microcontroller, which is susceptible with respect to Single Event Upset (SEU) or Single Event Latch-up (SEL) events. There is no particular need for the microcontroller to be tested or certified as being insusceptible to neutron radiation, as the embodiments described herein allow to handle SEU or SEL events reliably.

Embodiments described herein describe suggest to provide an auxiliary control voltage which may be used for controlling the SSSD in case the primary control voltage is not available reliably, e.g. because of an SEU or SEL event. During normal operation, i.e. when the primary controller is operative to supply the primary control voltage to the control terminal of the SSSD, the auxiliary control voltage is not needed, in principle. The auxiliary circuit may be configured to supply the auxiliary control voltage only when it is detected that the primary controller is inoperative. Alternatively, the auxiliary circuit may be configured to supply the auxiliary control voltage irrespective of the operation condition of the primary controller. In case the primary control voltage is available reliably, the auxiliary voltage will be commanded by the primary control voltage, or the auxiliary control voltage will not be effective in controlling the control terminal. This makes sure that the voltage applied to the control terminal is controlled by the primary control voltage when the primary controller is operative.

Particular embodiments may include any of the following optional features, alone or in combination:

In particular embodiments, the auxiliary control voltage may correspond to the primary control voltage supplied by the primary controller at the time of falling into the inoperative condition. Thereby, the condition of the SSSD is maintained when the auxiliary control voltage is supplied to the control terminal of the SSSD, e.g. in a case where the primary control voltage is no longer provided, since the primary controller has fallen into an inoperative condition. This allows to reset and restart the primary controller with the SSSD maintaining its condition as controlled by the auxiliary control voltage during the reset/restart phase of the primary controller.

Particular embodiments as described herein may use a memory unit configured to store information indicative of the primary control voltage applied by the primary controller at the time of falling into the inoperative condition. As the control voltage for the SSSD basically is a binary quantity having only two levels, the memory unit may have a simple configuration. Particularly, the memory unit may be a one bit memory unit configured to store one bit of information. E.g. the one bit memory unit may store the information "high" corresponding to switching the SSSD ON, or "low" corresponding to switching the SSSD OFF. In particular embodiments, the memory unit may have the configuration of a flip-flop or latch, e.g. the configuration of a D-flip-flop. A flip-flop or latch is a circuit that has two stable states and can be used to store state information. The circuit can be made to change state by signals applied to one or more control inputs and will have one or two outputs. A flip-flop or latch stores a single bit of data; one of its two states represents a "one" and the other represents a "zero". Flip-flops can be either simple (transparent or opaque) or clocked (synchronous or edge-triggered). The D flip-flop captures the value of its data input ("D-input") and outputs this value at the data output ("Q output"). Usually, the D flip-flop has a clock input and captures the value of the its data input at a definite portion of the clock cycle (such as the rising edge of the clock). At other times, the data output does not change. Other flip-flop or latch types may be used as well. The more simple the memory unit, the less susceptible it is expected to be with respect to neutron radiation.

In particular embodiments, the memory unit may be connected in between an output side of the primary controller and an input side of the control terminal of the SSSD. Thus, the memory unit will be connected serially to the primary controller with respect to the control terminal of the SSSD. Particularly, the memory unit may have a data input to which the primary control voltage is supplied, and a data output connected to the control terminal of the SSSD. The memory unit may remember the previous state of a control terminal output signal produced by the primary controller for controlling the control terminal of the SSSD. In this way, during normal operation, i.e. with the primary controller being operative, the memory unit will be commanded by the primary controller and will pass commands received from the primary controller to the control terminal of the SSSD. When the primary controller falls into an inoperative condition, the memory unit may output as the auxiliary control voltage the last previous state of the control terminal output signal as produced by the primary controller, which is stored in the memory unit.

Further, the memory unit may have a clock input supplied by a clock signal indicative of control cycles of the primary controller, and the memory unit may be configured to store information indicative of the primary control voltage applied by the primary controller in a previous or current control cycle. The memory unit may then provide the stored information at its data output, thus supplying the control terminal of the SSSD with the primary control voltage of a current control cycle when the primary controller is operative. In case the primary controller has been fallen into an inoperative condition and does no longer supply a clock signal and/or a primary control voltage at the data input of the memory unit, the memory unit may provide at the data output, as the auxiliary control voltage, the primary control voltage in the last control cycle with the primary controller being operative. Thus, the memory unit may be configured to supply the primary control voltage or the auxiliary control voltage at the data output of the memory unit.

Further, the memory unit may have a power input connected to a power supply of the primary controller. Thus, the memory unit is operative in case the primary controller is supplied with power, but will basically not be operative any more in case the primary controller loses its power supply. This is a desired characteristic, as in case of an SEU or SEL the primary controller will still be supplied with power, but will not deliver a reliable primary control voltage any more. In this situation, the SSSD may be controlled by the auxiliary control voltage from the auxiliary circuit, until the primary controller has been reset and started up again. In case the primary controller is operative and loses its power supply, it not desired to provide the auxiliary control voltage to the control terminal of the SSSD. As the memory unit is not supplied with power, and hence the auxiliary circuit is not active, the SSSD may be kept in an OFF condition in such situation.

Further, the control circuit may comprise a charge storing unit configured to temporarily supply the memory unit with electric power when the power supply of the primary controller is cut off. The charge storing unit may be configured to temporarily supply a voltage corresponding to the power supply to the power input of the memory unit. The charge storing unit may be a capacitor. The capacitor may be charged by the power supply of the primary controller. Thus, the capacitor may provide an auxiliary supply voltage corresponding the primary supply voltage of the primary controller to the memory unit. Provision of the charge storing unit allows to reset the primary controller by shortly interrupting the power supply of the primary controller, without affecting provision of the auxiliary control voltage by the memory unit. When the power supply of the primary controller is cut off for a short time, e.g. in order to reset the primary controller, the charge storing unit may temporarily provide a power supply to the memory unit, in order to allow the memory unit to provide the auxiliary control voltage during the time it takes to reset the primary controller, until the power supply of the primary controller is available again.

In particular embodiments, the memory unit may have a reset input for setting the data output of the memory unit to a default value. A reset signal may be input to the reset input under certain circumstances in order to avoid an undefined or undesired state of the data output of the memory unit.

Embodiments disclosed herein describe a way to detect if the primary controller is in an operative condition, i.e. if the primary controller is running and providing control commands for the control terminal of the SSSD. Particularly, both SEU and SEL may be detected. In case of SEU or SEL, the primary controller is not providing the primary control voltage, or at least not reliably providing the primary control voltage, although the primary controller is supplied with power. In particular embodiments, a status indicating signal of the primary controller may be used for detecting an inoperative condition. Thus, the control circuit may comprise a status indication circuit configured to provide a signal indicative of the status of the primary controller.

The status indicating signal may be obtained from a pulse signal created by the primary controller. E.g. the primary controller may have a status output and a control software running on the primary controller may be programmed to output a status indicating pulse signal at the status output when the control software is running. For example, the pulse signal may be output in regular time intervals when the control software is running. When the control software stops running, e.g. in case of an SEU or SEL; the pulse signal is no longer provided at the status output. This may be used for detecting whether the primary controller is operative or inoperative at a given time.

In embodiments, the status indication circuit may comprise a circuit for converting the pulse signal into a steady state signal. For example the status indicating circuit may comprise a charge pump circuit supplied by such pulse signal from the primary controller and providing a steady state signal indicative of the status of the primary controller. The charge pump circuit may rectify the pulse signal supplied by the primary controller, thereby obtaining a steady-state signal indicating the status of the primary controller. The steady-state signal may be a binary steady state signal, with the levels "high" and "low". E.g. "high" may indicate the that the pulse signal is supplied regularly and thus the primary controller is operative, while "low" may indicate that the pulse signal is not supplied any more and thus the primary controller is inoperative. In embodiments described herein, such binary steady-state signal is also referred to as an "ALIVE" signal.

In case the primary controller falls into an inoperative condition and does no longer provide control commands for the control terminal of the SSSD, e.g. caused by SEU or SEL, the status indicating signal will change. For example, the ALIVE signal described above may go from high to low when the primary controller falls into an inoperative condition and does no longer provide control commands for the control terminal of the SSSD. Nevertheless, it is expected that the primary controller is still supplied with its supply voltage in case of SEU or SEL.

Particularly, an output signal from the status indication circuit may be used to produce a reset of the memory unit under certain conditions. Thus, the output signal of the status indication circuit may be used to supply a reset signal to the reset input of the memory unit. Other signals may be used as well in such determination. Particularly, a signal indicative of the supply voltage of the primary controller (e.g. a signal corresponding to, or dependent on, the supply voltage of the primary controller) may be useful in determining the circumstances for producing a reset of the memory.

In particular embodiments, the control circuit further may comprise a comparator having a first comparator input supplied by an output of the status indication circuit; a second comparator input supplied by a signal indicative of the supply voltage of the primary controller, and a comparator output connected to the reset input of the memory unit. The output of the status indication circuit may be the steady state signal indicative of the status of the primary controller. The status indicating signal signal, particularly the binary steady-state status indication signal ALIVE, may be supplied to one of the inputs (e.g. the negative input) of the comparator. The other input of the comparator (e.g. the positive input) may be connected to the supply voltage of the primary controller. In this way, the comparator may be configured for generating a reset for the memory unit. For example, the output of the comparator may be connected to a reset input of the memory unit. In case the output of the comparator indicates "WRONG" (e.g. since the signal at the negative input is higher than the signal on the positive input), a "RESET" signal is output from the comparator output and input to the reset input of the memory unit. The "RESET" signal will set the output of the memory unit to its default (which will normally be "LOW" thus providing an "OFF" command to the control terminal of the SSSD). In case the output of the comparator indicates "TRUE" (e.g. since the signal at the negative input of the comparator is not higher than the signal at the positive input of the comparator), a "DO NOT RESET" signal will be output from the comparator and input to the reset input of the memory unit. Thus, the memory unit is not reset, i.e. the output of the memory unit will not be influenced by the signal input to the reset input.

In one example, a reset may be generated in case the primary controller is in an operative condition, i.e. in a condition providing appropriate control commands for the control terminal of the SSSD, but loses its power supply (so-called "RESET on power-down"). In a situation where the primary controller loses its supply power while in an operative condition, it is usually desired that the SSSD does not remain turned ON. Turning the SSSD to an OFF condition can be achieved by providing a RESET signal to the reset input of the memory unit on power-down.

Another example for generating a reset for the memory unit is a situation where the control circuit is started up from an inoperative condition, i.e. a situation where the primary controller is starting up from an operative condition and from a condition without any power supply (so-called "RESET on power-up"). In such situation, it is usually desired to have the SSSD in a defined condition, normally in the OFF condition. In a particular embodiment, filter capacitors at the comparator may be provided, which filter capacitors are selected such that at power-up a reset for the memory unit is created, so that the SSPC does not glitch on at power-up. Thereby, an unacceptable behavior of the SSPC on power-up is avoided.

In contrast, in a SEU or SEL situation where the primary controller has been fallen into an inoperative condition, but still is provided with its supply power, it might be expected that the next power cycle is initiated by any other controllers on the printed circuit board. Thereby, the primary controller is set up again and the inoperative condition is removed from the primary controller. Embodiments described herein allow to maintain the previous output state of the SSSD in such situations by use of the auxiliary control voltage provided by the auxiliary circuit. Particularly, such embodiments may use the status indicating signal as the reference to a reset comparator, thereby allowing to distinct between the condition where the primary controller has been fallen into an inoperative condition, but still is provided with its supply power, from the condition that the primary controller loses its supply power while in an operative condition.

Thereby, embodiments as described herein allow to smoothly control the power cycle of a controller affected by SEU or SEL without impacting the SSPC output state and without creating possibly unsafe conditions as a side effect during the power cycles.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawing in which:

DETAILED DESCRIPTION

Figure 1:
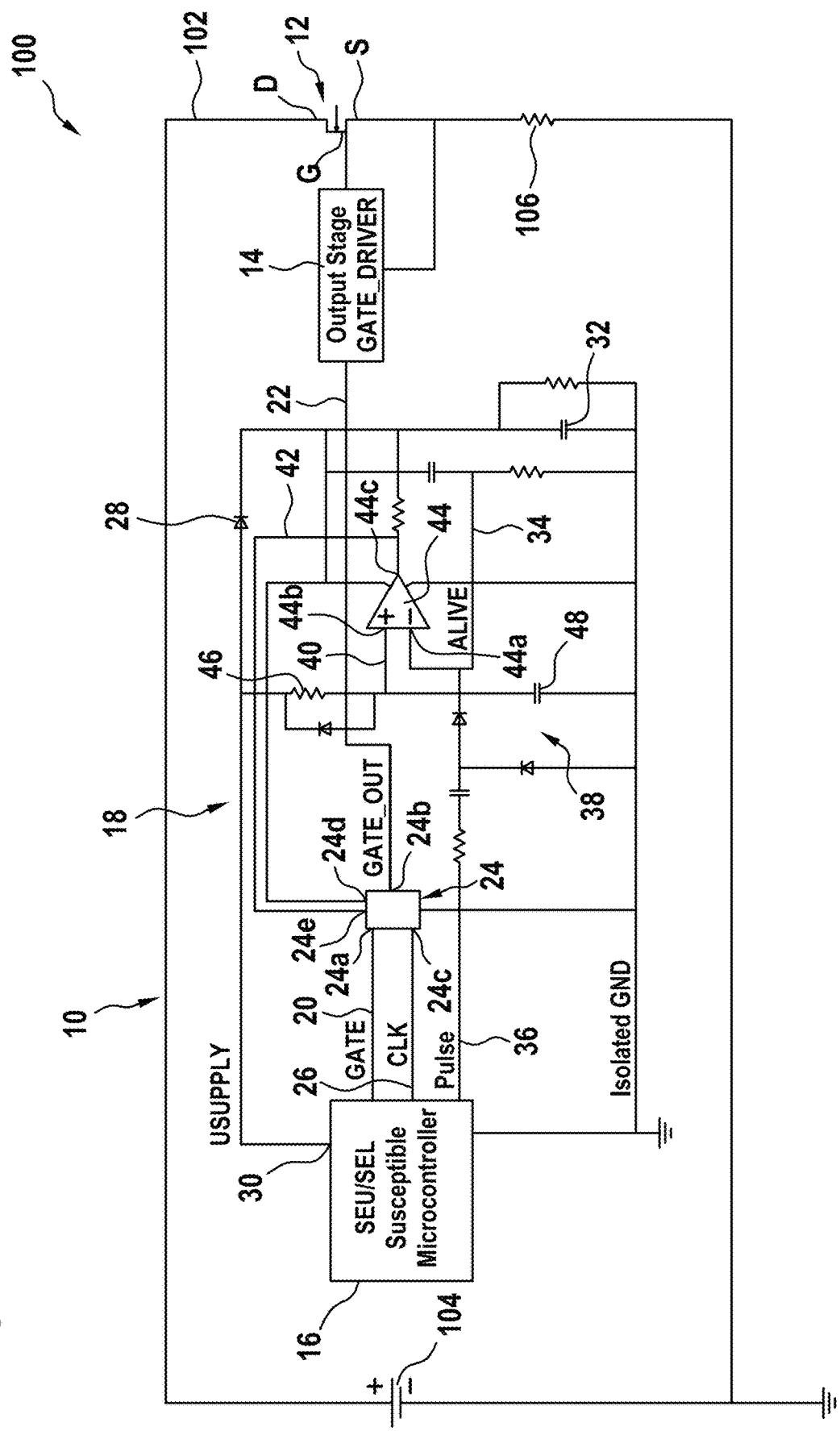
FIG. 1 is a simplified circuit diagram of one channel of an SSPC for a power distribution system, where the channel comprises a control circuit for supplying a control voltage to a control terminal of the SSPC, according to an embodiment of the present invention.

FIG. 1 shows a simplified circuit diagram of one channel of an SSPC 100 for a power distribution system. The SSPC channel shown in FIG. 1 comprises a control circuit 10 for supplying a control voltage to a control terminal G of an SSSD 12 of the SSPC channel, according to an embodiment of the present invention.

The SSPC 100 comprises a number of power distribution channels 102 connected in between an electrical power supply 104 and an aircraft load 106. Only one of these power distribution channels is shown in FIG. 1. The SSPC 10 distributes power from power supply 104 to the loads 106. The power supply 104 may be any kind of DC or AC power supply, e.g. a 28V DC power supply (as indicated in FIG. 1), or an 115V/400 Hz AC power supply, as commonly used in aircraft. It is to be understood that any number of power distribution channels may be connected parallel, as desired to achieve a desired current rating. In FIG. 1 aircraft load 106 is indicated schematically. It is to be understood that the load 106A may be one load, or a plurality of loads. Moreover, although the load 106 is indicated to be a resistive load, the load 106 may have any characteristics, like resistive, capacitive, and/or inductive characteristics.

The power distribution channel 102 includes a load current detecting unit for detecting a load current provided by the power distribution channel 102. The load current detecting unit may be configured to detect a voltage across a shunt resistor connected serially in the power distribution channel 102, e.g. in between the SSSD 12 and the load 106. The load current signal may be a voltage signal indicative of the load current. The voltage signal may be provided to the control circuit 10, particularly to an output stage GATE_DRIVER 14.

The power distribution channel 102 includes a power section and a control circuit 10. The power section comprises a solid state switching device (SSSD) 12 connected in series between the power supply 104 and the load 106. The SSSD 12 may be switched between an ON operation mode and an OFF operation mode. In the ON operation mode of the SSSD 12 the supply voltage provided by power supply 104 is electrically connected to the respective load 106. In the OFF operation mode of the SSSD 12 the supply voltage provided by power supply 104 is disconnected from the load 106.

The SSSD 12 may be based on any known semiconductor technology used for production of power switching devices. In one example, SSSD 12 may have the configuration of at least one field effect transistor. A particular embodiment of a field effect transistor is a Si-MOSFET (metal oxide semiconductor field effect transistor). The Si-MOSFET transistor may be made in NMOS technology. Other configurations are conceivable for the SSSD switching device 12 as well, particularly any other kind of switching devices or transistors based on Si technology, SiC technology, or similar semiconductors. SiC FET's are often used in applications where high thermal loads occur. The SSSD 12 includes a first terminal (in case of a MOSFET the first terminal is usually referred to as drain D), a second terminal (in case of the MOSFETs: source S), and a control terminal (in case of the MOSFET: gate G). Depending on a control voltage applied to the control terminal (gate G) with respect to the second terminal (source S), an electrical path between the first terminal (drain D) and the second terminal (source S)—referred to as "source-drain path"—will be open (ON condition), or closed (OFF condition). When the source-drain path of the SSSD 12 is in the ON condition, usually the source-drain path will be fully open (e.g. the electrical resistance of the source-drain path will be at a minimum), and the SSSD 12 operates in the ON operation mode. When the source-drain path of the SSSD 12 is in the OFF condition, the source-drain path will be closed (e.g. the electrical resistance of the source-drain path will be very large, or even infinity) and the SSSD 12 operates in the OFF operation mode.

In the following description, the control terminal of the SSSD 12 will be referred to as gate G, the first terminal will be referred to as the drain D, and the second terminal will be referred to as the source S, corresponding to the usual designations for a field effect transistor. It is to be understood that other designations might be used in case the SSSD has another configuration (e.g. base, emitter and collector in case of a bipolar transistor).

The control circuit 10 for providing a control voltage to the control terminal G of the SSSD 12 comprises the output stage GATE_DRIVER 14, a primary controller 16, and an auxiliary circuit 18.

The control circuit 10 is configured to control an electrical potential of the gate G of the SSSD 12. Depending on the electric potential of the gate G, the source-drain path of SSSD 12 will be conductive, thereby electrically connecting the drain D with the source S of the SSSD 12 ("ON" operation mode of the SSSD), or non-conductive, thereby isolating the drain D from the source S of the SSSD 12 ("OFF" operation mode of the SSSD). The SSSD 12 is configured to switch between ON operation mode and OFF operation mode based on commands supplied by the output stage GATE_DRIVER 14 based on command signals supplied by the primary controller 16 and/or auxiliary circuit 18 to the output stage GATE_DRIVER 14. The control commands are supplied from the primary controller 16 and the auxiliary circuit 18 via a GATE signal line 20 and a GATE_OUT signal line 22. A memory unit 24 is connected serially in between the GATE signal line 20 and the GATE_OUT signal line 22. The GATE signal line 20 is connected to the data input 24a of the memory unit 24. The GATE_OUT signal line 22 is connected to the data output 24b of the memory unit 24.

The primary controller 16 is operative to supply a primary control voltage to the control terminal G of the SSSD 12. The auxiliary circuit 18 is configured to supply an auxiliary control voltage to the control terminal G of the SSSD 12 in case the primary controller 16 falls into an inoperative condition. In an operative condition, the primary controller 16 supplies the primary control voltage to the control terminal G of the SSSD 12. In an inoperative condition, the primary controller 16 stops supplying the primary control voltage to the control terminal G of the SSSD 12, or at least fails to reliably supply the primary control voltage to the control terminal G of the SSSD 12. An inoperative condition may be a Single Event Upset (SEU) or a Single Event Latch-up (SEL) caused by neutron radiation.

Particularly, the primary controller 16 may include a microcontroller, e.g. a commercially available microcontroller, which is susceptible with respect to Single Event Upset (SEU) or Single Event Latch-up (SEL) events.

The auxiliary circuit 18 provides an auxiliary control voltage which may be used for controlling the SSSD 12 in case the primary control voltage is not available reliably, e.g. because of an SEU or SEL event. The auxiliary control voltage corresponds to the primary control voltage supplied by the primary controller 16 at the time of falling into the inoperative condition. Thereby, the condition of the SSSD 12 is maintained when the auxiliary control voltage is supplied to the control terminal G of the SSSD 12, e.g. in a case where the primary control voltage is no longer provided, since the primary controller 16 has fallen into an inoperative condition. This allows to reset and restart the primary controller with the SSSD 12 maintaining its condition as controlled by the auxiliary control voltage during the reset/restart phase of the primary controller 16.

The auxiliary circuit 18 comprises a memory unit 24 configured to store information indicative of the primary control voltage applied by the primary controller 16 at the time of falling into the inoperative condition. As the control voltage for the SSSD 12 basically is a binary quantity having only two levels, the memory unit 24 may have a simple configuration. In the embodiment shown, the memory unit 24 is a one bit memory unit configured to store one bit of information, "high" corresponding to switching the SSSD 12 ON, or "low" corresponding to switching the SSSD 12 OFF. The memory unit 24 shown in FIG. 1 has the configuration of a D-flip-flop.

The memory unit 24 is connected in between an output side of the primary controller 16 and an input side of the output stage GATE_DRIVER 14. Thus, the memory unit 24 is connected serially to the primary controller 16 with respect to the control terminal G of the SSSD 12. The memory unit 24 has a data input 24a to which the primary control voltage is supplied from the primary controller 16 via GATE signal line 20, and a data output 24b connected to the output stage GATE_DRIVER 14 via GATE_OUT signal line 22. The memory unit 24 remembers the previous state of a control terminal output signal produced by the primary controller 16 for controlling the control terminal G of the SSSD 12. In this way, during normal operation, i.e. with the primary controller 16 being operative, the memory unit 24 will be commanded by the primary controller 16 and will pass commands received at its data input 24a from the primary controller 16 to its data output 24b and thus to the control terminal G of the SSSD 12.

The memory unit 24 also has a clock input 24c supplied by a clock (CLK) signal 26. The clock signal 26 is provided by the primary controller 16 and thus is indicative of control cycles of the primary controller. The memory unit 24 is configured as an edge-triggered D flip-flop and thus stores information indicative of the primary control voltage applied by the primary controller 16 at the data input 24a in a current control cycle, as indicated by the clock signal 26 received at its clock input 24c. The memory unit 24 provides the stored information at its data output 24b. Thus, the memory unit supplies the output stage GATE_DRIVER 14 with the current value of the primary control voltage each time it receives a clock signal 26 at its clock input 24c. In case the primary controller 26 has been fallen into an inoperative condition, it does no longer supply a clock signal 26 at the clock input 24c and thus the primary control voltage at the data input 24a of the memory unit 24 will not be updated any more. In this way, the memory unit 24 provides, as the auxiliary control voltage, at its data output 24b the primary control voltage in the last control cycle in which the primary controller was operative. Thus, the memory unit 24 is configured to supply the primary control voltage or the auxiliary control voltage at the data output 24b of the memory unit 24, depending on whether the primary controller is operative or not.

Further, the memory unit 24 has a power input 24d connected to a power supply 30 of the primary controller 16 via a rectifier 28 (e.g a diode). Power supply 26 provides a supply voltage USUPPLY to the memory unit 24. Thus, the memory unit 24 is operative in case the primary controller 16 is supplied with power and thus able to deliver the supply voltage USUPPLY, but will basically not be operative any more in case the primary controller 16 loses its power supply. This is a desired characteristic, as in case of an SEU or SEL the primary controller 16 will still be supplied with power, but will not deliver any more primary control voltage GATE to the data input 24a of the memory unit 24. In this situation, the SSSD 12 may be controlled by the auxiliary control voltage output from the auxiliary circuit 18 at data output 24b, until the primary controller 16 has been reset and started up again such as that primary control voltage GATE is again reliably supplied to the data input 24a of the memory unit 24. However, in case the primary controller 16 is operative, but loses its power supply, it is not desired to provide the auxiliary control voltage to the control terminal of the SSSD 12. In the embodiment shown, the memory unit 24 is not supplied with power in such situation, and hence the auxiliary circuit 18 is not active. Thus, the SSSD 12 may be switched to an OFF condition.

Figure 2:
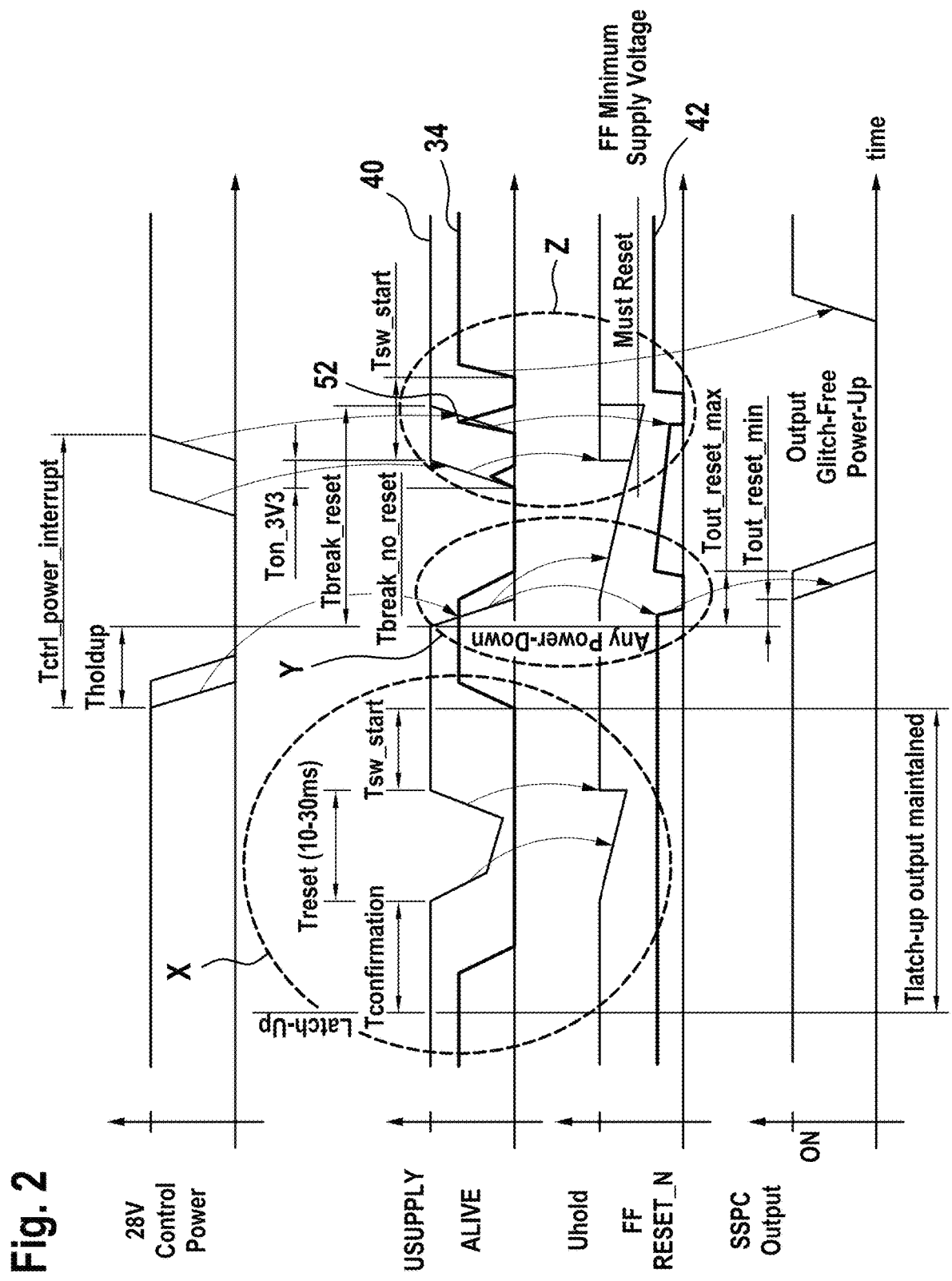
FIG. 2 is a diagram showing various voltages in the control circuit of FIG. 1 over time, during various operating conditions.

A usual way to reset the primary controller 16 after a SEL or SEU is to momentarily cut off power supply to the primary controller 16. An undesired side effect of this procedure would be that the memory unit 24 would also momentarily lose its power supply and thus would not be able to deliver the auxiliary control voltage to the output stage GATE_DRIVER 14 for that time. Therefore, the auxiliary control circuit 18 also comprises a charge storing unit 32 configured to temporarily supply the memory unit 24 with electric power when the power supply of the primary controller 16 is cut off for resetting the primary controller 16. The charge storing unit 32 is configured to temporarily supply a voltage corresponding to the normal supply voltage USUPPLY to the power input 24d of the memory unit 24. The charge storing unit may be a capacitor. The capacitor may be charged by the power supply of the primary controller 16, in the time where the primary controller 16 is operative. When the primary controller loses its power supply, the charge storing unit 32 provides an auxiliary supply voltage corresponding the primary supply voltage of the primary controller 16 at the power input 24d of the memory unit 24. The rectifier 28 separates the power supply branches. As long as the primary controller 16 is operative and supplies the supply voltage USUPPLY at its power supply 30, the rectifier 28 is conductive, thus charging the charge storing unit 32. As soon as the supply voltage USUPPLY is breaking down, the rectifier 28 blocks and the charge storing unit 32 discharges and provides the supply voltage at the power input 24d. In this phase, the supply voltage at power input 24d will slightly drop starting from an initial value equal to the supply voltage USUPPLY, according to the discharge characteristic of the charge storing unit 32. This can be seen in the detail X in FIG. 2 showing the supply voltage at power input 24d of the memory unit during a Single Event Latch-Up, where USUPPLY denotes the supply voltage provided at the output 30 of the primary controller 16, and Uhold denotes the auxiliary supply voltage provided by the charge storing unit 32. The Single Event Latch-Up occurs during a time where the signal "ALIVE" is high, indicating that the primary controller 16 is operative. The "ALIVE" signal will go low afterwards as the primary controller 16 is no longer active. During this time period, the SSPC output is hold ON, although the respective control voltage commands from the primary controller 16 are missing during this time period. This is achieved by providing the auxiliary control voltage at the data output 24b of the memory unit 24, as described above. In the time period denoted "Treset (10-30 ms)" in FIG. 2 the primary controller 16 is reset and thus USUPPLY breaks down. The charge storing unit 32 provides the auxiliary supply voltage Uhold to the power input 24d during this reset time. This allows the memory unit 24 to still provide the stored auxiliary control voltage at the data output 24b even during the time the primary controller 16 is reset and thus cut off from its power supply. Thus, provision of the charge storing unit 32 allows to reset the primary controller 16 by shortly interrupting the power supply of the primary controller 16, without affecting provision of the auxiliary control voltage by the memory unit 24.

The memory unit 24 further includes a reset input 24e for setting the data output 24b of the memory unit 24 to a default value. The default value will usually be a value corresponding to the "OFF" condition of the SSSD 12. A reset signal 42 may be input to the reset input 24e under certain circumstances in order to avoid an undefined or undesired state of the data output 24e of the memory unit 24, and thus an undefined or undesirable condition of the SSSD 12.

The embodiment shown in FIG. 1 allows to detect if the primary controller 16 is in an operative condition, i.e. if the primary controller 16 is running and providing appropriate control commands according to the required control voltage of the control terminal G of the SSSD 12. In case of SEU or SEL, the primary controller 16 is not, or at least not reliably, providing control commands for the primary control voltage to the data input 24a of memory unit 24, although the primary controller 16 is supplied with power. To detect this condition, the control circuit 10 also comprises a status indication circuit configured to provide an ALIVE signal 34 indicative of the status of the primary controller 16. The ALIVE signal 34 is used for supplying a reset signal to the reset input 24e of the memory unit 24, as described below.

The ALIVE signal 34 is obtained from a PULSE signal 36 created by the primary controller 16. To obtain the PULSE signal 36, the primary controller 16 may have a status output and a control software running on the primary controller 16 may be programmed to output a status indicating pulse signal at the status output when the control software is running. For example, the PULSE signal 36 may be output in regular time intervals when the control software on the primary controller 16 is running. When the control software stops running, e.g. in case of an SEU or SEL; the PULSE signal 36 ceases to be provided. Thus, the PULSE signal 36 may be used for detecting whether the primary controller 16 is operative or inoperative at a given time. The status indication circuit further comprises a circuit for converting the PULSE signal 36 into a steady state signal. In the embodiment shown, the status indicating circuit may comprise a charge pump circuit 38 supplied by the PULSE signal 36 from the primary controller 16. The charge pump circuit 38 rectifies the PULSE signal 36 and provides a steady state signal 34 indicative of the status of the primary controller 16. This steady state signal is referred to as the ALIVE signal 34. The ALIVE signal 34 may be a binary steady state signal with the levels "high" and "low", "high" indicating the that the PULSE signal 34 is supplied regularly and thus the primary controller 16 is operative, "low" indicating that the pulse signal 34 is not supplied any more and thus the primary controller 16 is inoperative.

The ALIVE signal 34 is used to produce a reset of the memory unit 24 under certain conditions, as set out below.

In addition, a signal 40 indicative of the supply voltage of the primary controller 16 is used in determining the circumstances for producing a reset of the memory unit 24. For producing the reset signal 42, the control circuit 10 further comprises a comparator 44 having a first comparator input 44a supplied by the ALIVE signal 34, a second comparator input 44b supplied by a signal 40 indicative of the supply voltage of the primary controller 16, and a comparator output 44c connected to the reset input 24e of the memory unit 24. The ALIVE signal 34 is supplied to the negative input 44a of the comparator 44. The supply voltage of the primary controller 16 is supplied to the positive input 44b of the comparator 44 via an RC member 46, 48. In case the output 44c of the comparator 44 is the lower value indicating "WRONG" (since the ALIVE signal 34 supplied to the negative input 44a is higher than the supply voltage signal 40 supplied to the positive input 44b), a "RESET" signal is output from the comparator output 44c and input to the reset input 24e of the memory unit 24 (in the embodiment shown in FIG. 1, the lower output value of the comparator 44 is GND, corresponding to the RESET signal to be supplied to the reset input 24e of the memory unit 24 for triggering a reset). The "RESET" signal will set the data output 24c of the memory unit 24 to its default value (which will normally be "LOW", thus providing an "OFF" command to the control terminal G of the SSSD 12). In case the output 44c of the comparator 44 indicates "TRUE" (since the ALIVE signal 34 supplied to the negative input 44a of the comparator 44 is not higher than the supply voltage signal 40 supplied to the positive input 44b of the comparator 44), a "DO NOT RESET" signal will be output from the comparator 44 and input to the reset input 24e of the memory unit 24. In this case, the memory unit 24 is not reset, i.e. the data output 24b of the memory unit 24 will not be influenced by the signal input to the reset input 24e.

A reset is generated for the memory unit 24 in case the primary controller 16 is in an operative condition, i.e. in a condition providing appropriate control commands for the control terminal G of the SSSD 12, but loses its power supply (so-called "RESET on power-down"). When the primary controller 16 loses its supply power while in an operative condition, it is usually desired that the SSSD 12 does not remain turned ON. Turning the SSSD 12 to an OFF condition can be achieved by providing a RESET signal to the reset input 24e of the memory unit 24 on power-down. This situation is shown in the detail Y of FIG. 2. At the moment of loss of power, the supply voltage USUPPLY for the primary controller 16 drops. The ALIVE signal 34 also drops upon the loss of power event, however only with some delay with respect to the supply voltage USUPPLY which is supplied (see signal 40 in FIG. 1) to the positive input 44b of the comparator 44. Therefore, the ALIVE signal 34 supplied to the negative input 44a of the comparator 44 becomes larger than the signal 40 indicative of USUPPLY. In this moment, the RESET signal at the output 44c of comparator 44 becomes low, and thus the RESET signal 42 triggers a reset of the memory unit 24, as indicated by line "FF_RESET_N" in FIG. 2.

Another situation for generating a reset for the memory unit 24 occurs when the control circuit 10 is started up from a fully inactive condition, i.e. a situation where the primary controller 16 is starting up from an operative condition and from a condition without any power supply (so-called "RESET on power-up"). Such situation is illustrated by the detail Z in FIG. 2. In such situation, it is usually desired to have the SSSD 12 in a defined condition, normally in the OFF condition, and therefore a reset is to be carried for the memory unit 24. To achieve such reset before the control circuit 10 becomes operative, RC member 46, 48 including a filter resistor 46 and filter capacitor 48 is provided at the positive input 44b of the comparator 44. The RC member 46, 48 is selected such that the increase of the signal 40 at the input of the positive input 44b of the comparator 44 is somewhat delayed at power-up with respect to the corresponding increase in the ALIVE signal 34 supplied to the negative input 44a of the comparator 44 (see reference numeral 52 in FIG. 2). This creates a reset for the memory unit 24 and thus avoids that the SSPC 10 experiences a glitch on at power-up. Thereby, an unacceptable behavior of the SSPC on power-up is avoided.

In contrast to the two situations described above, in a SEU or SEL situation, as indicated in detail X in FIG. 2, the primary controller 16 has been fallen into an inoperative condition, but still is provided with its supply power. It is to be expected that any other primary controller on the printed circuit board (which controls another SSPC channel) initiates the next power cycle for the inoperative primary controller 16, such as to set up again the primary controller 16 and remove the inoperative condition from the primary controller 16. The embodiment shown in FIGS. 1 and 2 allows to maintain the previous output state of the SSSD 12 in such situations by use of the auxiliary control voltage provided by the auxiliary circuit 18, until the primary controller 16 is reset and set up.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A control circuit configured to supply a control voltage to a control terminal (G) of a solid state switching device of a solid state power controller, the solid state switching device having a first terminal (D), a second terminal (S), and the control terminal (G), the solid state switching device configured to switch between an OFF operation mode in which the second terminal (S) is electrically disconnected from the first terminal, and an ON operation mode in which the second terminal (S) is electrically connected to the first terminal (D), according to the control voltage applied to the control terminal (G);

wherein the control circuit comprises:
   a primary controller operative to supply a primary control voltage to the control terminal (G) of the solid state switching device; and
   an auxiliary circuit configured to supply an auxiliary control voltage to the control terminal (G) of the solid state switching device in case the primary controller falls into an inoperative condition, wherein the auxiliary circuit comprises a memory unit configured to store information indicative of the primary control voltage applied by the primary controller at the time of falling into the inoperative condition, wherein the memory unit has the configuration of a flip-flop or latch and has a power input connected to a power supply of the primary controller, wherein the control circuit further comprises a charge storing unit configured to temporarily supply the memory unit with electric power when the power supply of the primary controller is cut off, wherein the memory unit is connected in between an output side of the primary controller and an input side of the control terminal (G), and has a data input to which the primary control voltage is supplied, and a data output connected to the control terminal (G) of the solid state switching device, wherein the memory unit has a clock input supplied by a clock signal indicative of control cycles of the primary controller, and the memory unit is configured to store information indicative of the primary control voltage applied by the primary controller in a previous or current control cycle, and wherein the memory unit has a reset input for setting the data output of the memory unit to a default value.

2. The control circuit according to claim 1, wherein the auxiliary control voltage corresponds to the primary control voltage supplied by the primary controller at the time of falling into the inoperative condition.

3. The control circuit according to claim 1, wherein the memory unit is configured to supply the primary control voltage or the auxiliary control voltage at the data output.

4. The control circuit according to claim 1, wherein the memory unit is a one bit memory unit.

5. The control circuit according to claim 4, wherein the memory unit has the configuration of a D-flip-flop.

6. The control circuit according to claim 1, further comprising a status indication circuit configured to provide a signal indicative of the status of the primary controller.

7. The control circuit according to claim 6, wherein the status indication circuit comprises a charge pump circuit supplied by a pulse signal from the primary controller and providing a steady state signal indicative of the status of the primary controller.

8. The control circuit according to claim 7, further comprising a comparator having a first comparator input supplied by the signal indicative of the status of the primary controller; a second comparator input supplied by a signal indicative of the power supply of the primary controller, and a comparator output connected to the reset input of the memory unit.

9. A solid state power controller configured to supply electric power from a power supply to at least one load, the solid-state power controller comprising a control circuit according to claim 1.

* * * * *